United States Patent [19]
Ahlburn

[11] Patent Number: 5,650,359
[45] Date of Patent: Jul. 22, 1997

[54] COMPOSITE DIELECTRIC PASSIVATION OF HIGH DENSITY CIRCUITS

[75] Inventor: Byron T. Ahlburn, Dallas, Tex.

[73] Assignee: Texas Instruments Incorporated, Dallas, Tex.

[21] Appl. No.: 473,416

[22] Filed: Jun. 7, 1995

Related U.S. Application Data

[62] Division of Ser. No. 698,743, May 6, 1991, abandoned.

[51] Int. Cl.$^6$ .................................................. H01L 21/02
[52] U.S. Cl. ........................... 437/235; 437/238; 437/241
[58] Field of Search ................................... 437/235, 238, 437/241

[56] References Cited

U.S. PATENT DOCUMENTS

| | | | |
|---|---|---|---|
| 4,845,054 | 7/1989 | Mitchenel | 437/238 |
| 4,872,947 | 10/1989 | Wang et al. | 156/643 |
| 4,926,243 | 5/1990 | Nakagawa et al. | 357/84 |
| 5,005,058 | 4/1991 | Tanaka | 357/17 |
| 5,031,021 | 7/1991 | Baba et al. | 357/33 |
| 5,041,897 | 8/1991 | Machida et al. | 357/51 |
| 5,051,380 | 9/1991 | Maeda et al. | 437/238 |
| 5,069,747 | 12/1991 | Cathey et al. | 156/643 |
| 5,100,501 | 3/1992 | Blumenthal et al. | 156/643 |

*Primary Examiner*—Trung Dang
*Attorney, Agent, or Firm*— Gary Honeycutt; Rene' Grossman; Richard Donaldson

[57] ABSTRACT

A composite dielectric film for final passivation of an integrated circuit. First, plasma-enhanced TEOS oxide is deposited to a thickness of 2000 Å, followed by thermal $O_3$-TEOS oxide to a thickness of 8000 Å, and then silicon nitride to a thickness of 10,000 Å.

3 Claims, 1 Drawing Sheet

TECHNIQUE OF THE INVENTION

TECHNIQUE OF THE INVENTION

COMPOSITE DIELECTRIC PASSIVATION OF HIGH DENSITY CIRCUITS

This is a division of application Ser. No. 07/698,743, filed May 6, 1991, now abandoned.

FIELD OF THE INVENTION

This invention relates to the deposition of a composite dielectric film as the final overcoat protection for an integrated circuit. Improved mechanical and electrical characteristics are obtained.

BACKGROUND OF THE INVENTION

As 16 Megabit DRAM devices move toward production, the requirements placed on dielectric films used for inter-metal isolation exceed the capabilities of traditional films and techniques. First-level metal spaces as small as 0.5 micron and metal thickness as great as 0.9 micron are encountered. For these dimensions standard deposition techniques such as plasma TEOS CVD (PETEOS) result in voids or sharply cusped seams between the leads.

These issues can be addressed by the use of spin-on glasses (SOG), but these films tend to crack and absorb and release water vapor and other gases, which interfere with subsequent processing. Therefore, blanket etchback is often used to remove the SOG from the vicinity of vias. Achieving good planarization using SOG techniques generally requires multiple coat/cure cycles and the surface planarity is generally degraded by the plasma loading effects during etchback. Sequential depositions and etchbacks of TEOS oxides can provide filling of submicron gaps and a smoothed surface profile. This approach is generally effective only for gaps greater than 0.7 micron. The degree of planarity required over widely spaced metal lines for 16 Megabit devices is rather difficult to achieve using such prior techniques.

Similarly stringent requirements have also emerged for the protective over coat dielectric. Inter-lead capacitance becomes a limiting factor in device speed and performance, thus the leads need to be isolated by a material having a lower dielectric constant than traditional plasma nitride film. Secondly, a smaller cross section of the metal leads increases their susceptibility to mechanical displacement or rupture from forces created during the packaging process. This, as well as the advent of the Lead Over Chip (LOC) packages in which the top of the chip is taped to the bottom of the lead frame makes smoothing of the top chip surface very desirable.

BRIEF SUMMARY OF THE INVENTION

This invention provides an advanced dieletric deposition and planarization scheme for submicron gap filling and planarization. The main tool for improvement in the gap filling is the use of thermal ozone-TEOS oxide film deposited at 400–700 Torr which will be referred to as SACVD (subatmospheric CVD). These films exhibit exceptional gap filling properties and have better moisture and cracking resistance. They exhibit higher density than films produced by $O_3$-TEOS CVD at lower pressures (60–100 Torr). However, the film deposition is dependent on the type of underlying surface material, similarly to the results reported for $O_3$-TEOS CVD at atmospheric pressure. This effect as well as pattern sensitivity can be substantial when metal is exposed directly to the $O_3$ and TEOS. As a solution to this problem, a thin layer of PECVD TEOS oxide (1,000 to 3,000 Angstroms) is deposited in-situ prior to SACYD. This provides a uniform nucleation layer for the SACVD oxide.

The gap filling properties of the SACVD film were tested for gaps as small as 0.5 micron having an aspect ratio of 2.0. Superior submicron gap filling and self-planarization were obtained using the PECVD/SACVD combination as a part of the protective overcoat sequence. This deposition process has succeeded in essentially planarizing areas having closely spaced leads, and in displacing the nitride layer from the immediate vicinity of the isolated metal leads. This sequence is further enhanced by depositing a nitride film directly after the SACVD oxide deposition.

DRAWINGS

Figure 1:
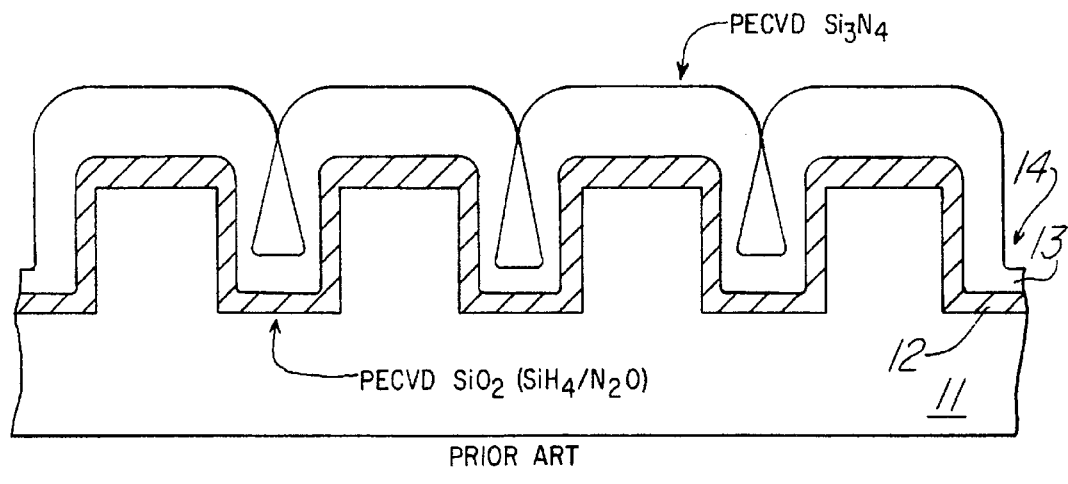
FIG. 1 is an enlarged cross section of an integrated circuit, illustrating the prior art films most commonly used for final passivation.

In FIG. 1, circuit 11 includes closely-spaced metal lines separated by as little as 0.5 micron. Since the metal thickness is typically 0.9 micron, step coverage using conventional techniques is clearly inadequate. Oxide film 12 is covered by nitride film 13. Note that voids in the nitride remain between each metal line. Moreover, edge effects produce defects at area 14. Also, final planarization is inadequate. These problems degrade both circuit performance and mechanical reliability.

PREFERRED EMBODIMENT

Figure 2:
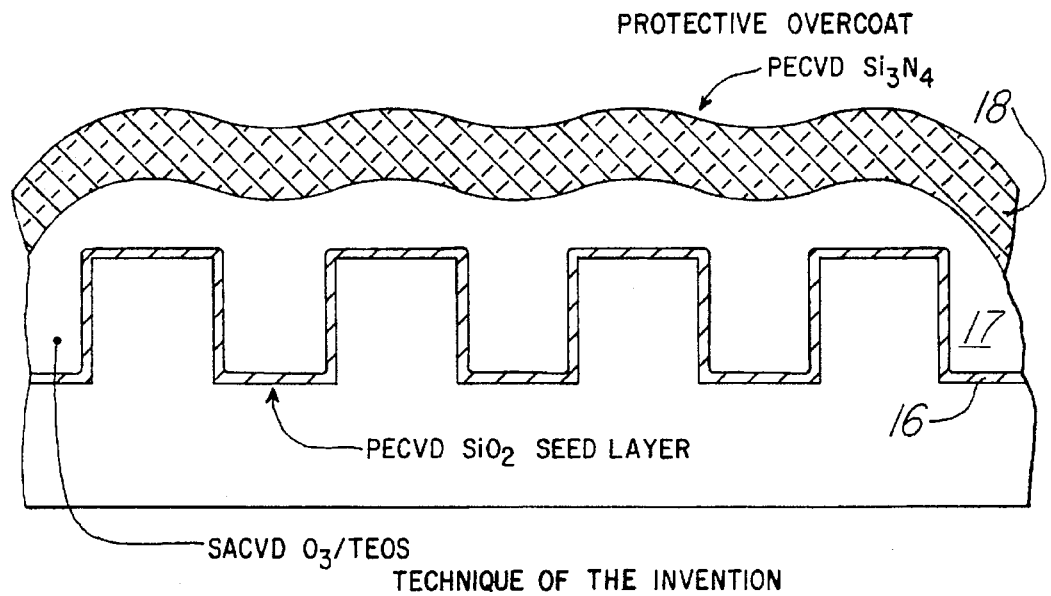
FIG. 2 is an enlarged cross section of an integrated circuit, illustrating the 3-layer composite film of the invention.

In FIG. 2, the sequence of the invention is seen to begin with the deposition of silicon oxide by a plasma-enhanced decomposition of TEOS to form seed layer 16. Preferred conditions include a TEOS flow of 400–500 sccm, an $O_2$ flow of 450–550 sccm, a Helium diluent flow of about 500 sccm, a temperature of 340 degrees C., and rf power levels of 400 to 500 watt. A film thickness of 2000 Å is preferred. These conditions are required, to obtain uniform step coverage over metal lines and adjacent oxide surfaces. Layer 17 is then deposited by a thermal reaction of ozone with TEOS. Preferred conditions include a temperature of 375 degrees C., a flow of about 3000 sccm for $O_2+O_3$, an $O_3:O_2$ ratio of 0.04–0.08, and a pressure of 600 Torr. Preferred film thickness is 8000 Å. Oxygen sources other than ozone do not yield satisfactory results. Attempts to deposit layer 17 without an initial seed layer have also failed to eliminate defects similar to those shown in FIG. 1.

Final layer 18 of silicon nitride is deposited in the conventional manner, by plasma-enhanced reaction of silane plus ammonia at temperatures in the 200–400 degrees C range. A film thickness of 10,000 Angstroms is generally sufficient, while thicker films may be desired for greater protection.

What is claimed is:

1. A method for the formation of a final passivation composite on an integrated circuit comprising the steps of:
   a) depositing an initial film of silicon oxide on the circuit by a plasma-enhanced decomposition of TEOS until said initial layer has a thickness of only 1,000 to 3,000 Angstroms, and terminating said deposition at that time;
   b) then depositing a second film of silicon oxide on said initial film, by reacting ozone with TEOS until said second film has a thickness of 6,000 to 10,000 Angstroms, and terminating said deposition at that time; and
   c) then depositing a final film of silicon nitride on said second film.

2. A method as in claim 1 wherein the initial film is deposited at a temperature of 200 degrees C. to 600 degrees C.

3. A method as in claim 2 wherein the second film of silicon oxide is deposited at a pressure of 400 to 700 Torr.

* * * * *